Oct. 29, 1968

J. KATZ 3,408,611

PRINTED CIRCUIT BOARD CONNECTOR

Filed June 3, 1966

2 Sheets-Sheet 1

INVENTOR:
JACK KATZ
By Keith D. Beecher
ATTORNEY

Oct. 29, 1968 J. KATZ 3,408,611
PRINTED CIRCUIT BOARD CONNECTOR
Filed June 3, 1966 2 Sheets-Sheet 2
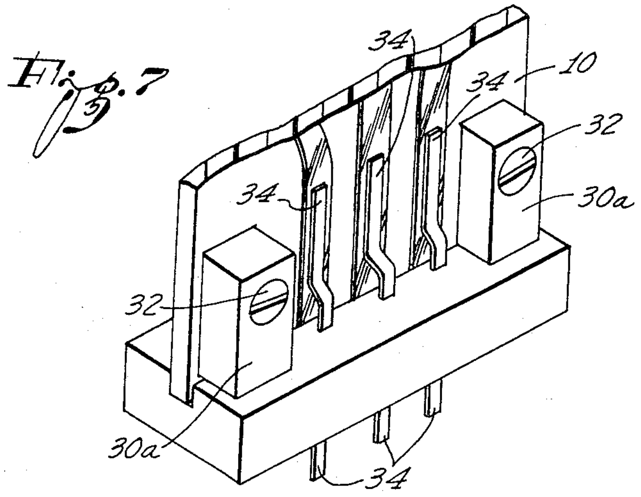
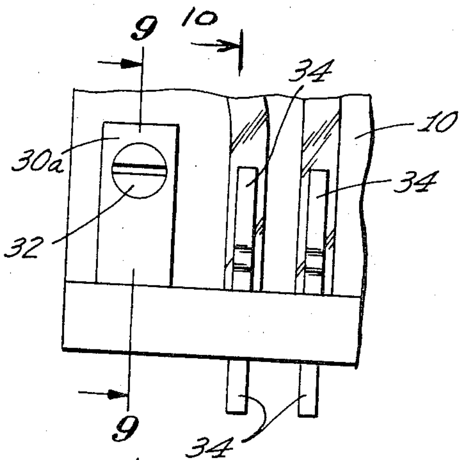
FIG. 8
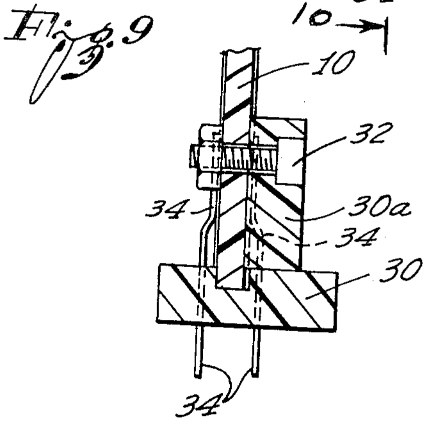
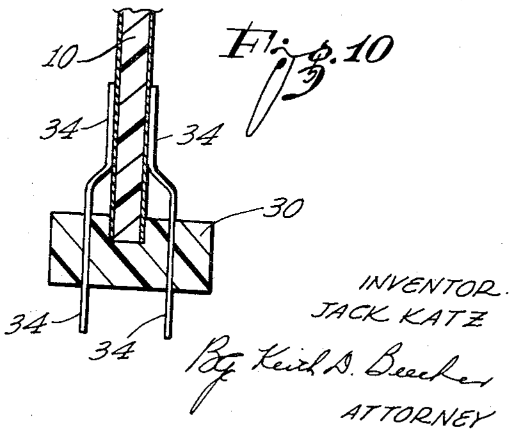
INVENTOR.
JACK KATZ
By Keith D. Beecher
ATTORNEY United States Patent Office 3,408,611

Patented Oct. 29, 1968

3,408,611

PRINTED CIRCUIT BOARD CONNECTOR

Jack Katz, 6630 W. Colgate Ave., Los Angeles, Calif. 90048

Filed June 3, 1966, Ser. No. 555,020
2 Claims. (Cl. 339—17)

ABSTRACT OF THE DISCLOSURE

A plug-in type connector for a printed circuit board is provided which has a plurality of contacts mounted in side-by-side relationship in an elongated insulated housing. The housing is positioned at one end of the printed circuit board within a notch. Each of the contacts includes a pair of resilient conductive strips which extend out from one face of the housing and along corresponding printed circuit conductors on the board and are electrically connected thereto by soldering, or otherwise.

The present invention relates to printed circuit boards/connector assemblies; and it relates more particularly to an improved terminal connector for a printed circuit board, and to an improved printed circuit board/connector combination.

It is common practice for printed circuit boards to be provided with a plug-in type of terminal connector, so that each board can be plugged in and out of the equipment in which it is used. In such cases the terminal connector is usually mounted at one end of the board. It is also common practice for the printed circuit board, with or without the terminal connector, to be plugged into a connector affixed to other printed circuitry.

In accordance with the usual prior art practice, the connector for a printed circuit board consists of an elongated insulated housing, and a plurality of contacts mounted in mutually-insulated side-by-side relationship within the insulated housing.

These contacts are usually connected to the printed circuit on the associated circuit board, by drilling a hole in the board for each contact, and by staking an eyelet in each hole; these eyelets serving to connect the contacts in the insulated housing to respective leads of the printed circuitry on the board.

The prior art printed circuit board/connector combinations, however, have usually involved a large amount of handling and detail, for example, in the accurate location of and drilling of holes and staking of eyelets; and for that reason are relatively expensive.

In the practice of the present invention, a plug-in type connector is provided having a plurality of contacts mounted in side-by-side relationship in an elongated insulated housing, such as in the prior art connectors. Each of the contacts includes a conductive elongated terminal strip which extends out from one face of the housing. As will be described, the improved connector of the invention may be of the male or female type, and the connections to the printed circuit board extend from the connector either at right angles to or parallel to the plane of the printed circuit board.

In accordance with the concepts of the invention, these terminal strips are such that they extend in a plane spaced from the aforesaid face of the housing, and essentially parallel thereto.

It is usual in printed circuit boards to provide printed circuit conductive terminal strips which are disposed in side-by-side relationship at one end of the board. The printed circuitry on the board is connected to respective ones of the terminal strips, so that the connections may be made between the circuitry and other parts of the equipment, these connections being made through connectors which are mounted on the boards, as mentioned above.

When the connector of the present invention is used, it is merely necessary to slip the terminal strips thereof over the aforesaid printed circuit strips on the board, so that the connections may be made between the printed circuitry on the board and the respective contacts of the connector.

The connector of the invention may be secured to the board by any appropriate means. The connections between the terminal strips of the connector and the respective printed circuit strips on the board may be made by soldering or welding. As will be described, a notch may be provided in one end of the board to facilitate the mounting of the connector on the board.

An object of the invention, therefore, is to provide an improved connector for a printed circuit board which may be mounted on the board and connected to the printed circuitry thereon in a simple and expeditious means.

Another object of the invention is to provide an improved connector/printed circuit board combination incorporating the above-described features.

Other objects and advantages of the invention will become apparent from a consideration of the following description, when the description is considered in conjunction with the accompanying drawings, in which:

FIGURE 7 is a perspective view of a modified form of the invention;

FIGURE 8 is a fragmentary plan view of the embodiment of FIGURE 7;

FIGURE 9 is a section, substantially along the line 9—9 of FIGURE 8; and

FIGURE 10 is a section, substantially along the line 10—10 of FIGURE 8.

Figure 1:
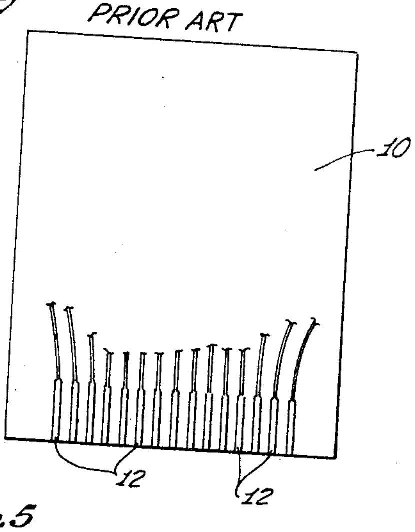
FIGURE 1 shows a usual prior art printed circuit board, of the type in widespread usage in digital computers, and in other electronic equipment.
Figure 2:
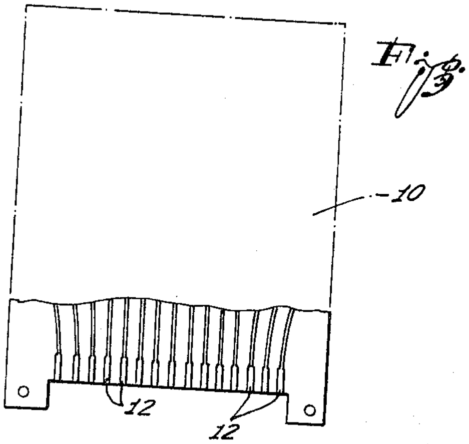
FIGURE 2 shows the circuit board of FIGURE 1 having a notch formed in one end thereof so as to receive the connector of the present invention.
Figure 5:
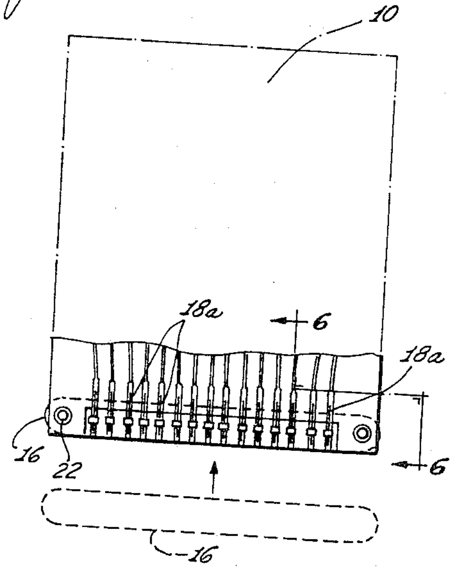
FIGURE 5 is a view of the printed circuit board of FIGURE 2 with the connector of FIGURE 3 mounted in place on the circuit board.
Figure 3:
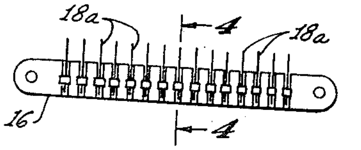
FIGURE 3 is a bottom view of a connector constructed in accordance with the concepts of the invention.

The printed circuit board 10 of FIGURES 1 and 2 may be any typical printed circuit board, constructed in known manner to have an appropriate printed circuitry on either or both faces thereof.

As is usual in the art, the printed circuitry on the circuit board 10 is terminated in a plurality of conductive printed circuit terminal strips 12 which are formed in side-by-side and mutually spaced relationship at one end of the board 10.

In order to receive the connector of the invention, a large notch may be formed at the end of the board to receive the terminal connector to be described, as shown in FIGURE 2.

Figure 4:
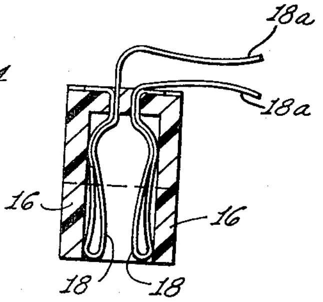
FIGURE 4 is a cross-sectional view of the connector of FIGURE 3, taken substantially on the line 4—4 of FIGURE 3.

The plug-in type of connector illustrated in the drawing includes an elongated housing 16 of, for example, plastic insulating material. The housing 16 includes a plurality of contacts 18. Each of the contacts 18, as shown in FIGURE 4, for example, may be formed of a resilient strip of conductive material. The contacts 18 may be of the double type, as shown, for independent connection to printed circuits on each side of the board 10.

Figure 6:
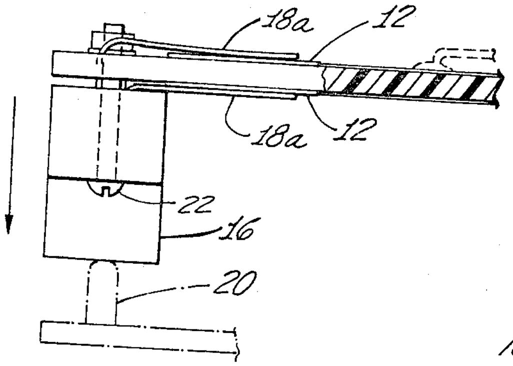
FIGURE 6 is a fragmentary sectional view taken essentially along the line 6—6 of FIGURE 5.

The resilient strip is bent in the housing 16 so as to have an appropriate female contact configuration, to receive (in plug-in relationship) the pins of an associated contact plug, such as designated 20, for example, in FIGURE 6. One end of each contact extends out from the face 16*a* of the housing 16 in the form of an elongated terminal strip 18*a*. Each of these strips extend in a plane essentially parallel to the mounting plane of the printed circuit board.

It will be appreciated that the illustrated plug-in terminal connector may be mounted on the end of the terminal board 10, merely by slipping the terminal strips 18*a* over the corresponding circuit terminal strips 12. When in place, the connector may be mounted on the board by screws 22, or rivets, or other appropriate fasteners extending through holes in the end of the housing 16 and through mating holes on the board.

When the connector is so in place, each of the terminal strips 18*a* extends along a corresponding printed circuit terminal strip 12, and makes electrical contact therewith. Appropriate soldering or welding techniques may be used to attach the terminal strips 18*a* to the respective printed circuit terminal strips 12.

It will be appreciated that the improved connector and connector/printed circuit board combination of the present invention may be constructed simply and inexpensively, and yet it provides a rigid and permanent connector means for the printed circuitry on the board.

The connector shown in FIGURES 1–6 is of the female type. It is evident, of course, that the contacts 18 may be replaced by a male type of contacts for plug-in connection into a further female type connector.

In the embodiment of FIGURES 7–10, a male type connector is used. The printed circuit board 10 fits into a channel which extends across the top face of the connector housing 30. The connector includes a pair of integral mounting blocks 30*a*, and a pair of screws 32 (or other appropriate fasteners) extend through the blocks and through the panel 10 to mount the connector on the panel.

A plurality of contacts 34 extends through the connector housing 30, as shown. The contacts 34 may be positioned in pairs along the length of the housing, and each extend along corresponding printed circuit conductors on each side of the board 10.

The contacts 34 are soldered or welded to the corresponding printed circuit conductors, as in the previous embodiment.

It will be appreciated, of course, that the contacts of the connector shown in FIGURES 3–6 may be parallel to the circuit board. Conversely, the contacts of the connector shown in FIGURES 7–10 may be made to fit at right angles to the circuit board.

While particular embodiments of the invention have been described, modifications may be made. Such modifications are intended to be covered in the appended claims.

What is claimed is:

1. A printed circuit board assembly including: a printed circuit board having a transverse notch at one end thereof and having a plurality of printed circuit conductors thereon, said printed circuit conductors being positioned in spaced side-by-side relationship at said one end of said printed circuit board; an elongated insulated connector housing mounted on said one end of said printed circuit board over said notch and extending transversely across said board; and a plurality of electrically conductive terminal contacts positioned within said connector housing adjacent one another and spaced and insulated from one another, said contacts being aligned with respective ones of said printed circuit conductors an engagement of said housing and said board, and said contacts each being configured to have corresponding integral strips extending out from the face of said housing into said notch and along corresponding ones of said printed circuit conductors parallel thereto and in electrical contact therewith.

2. The combination defined in claim 1 in which each of said electrically conductive terminal contacts is composed of resilient metallic strips configured as a female contact extending perpendicular to the plane of said printed circuit board.

References Cited

UNITED STATES PATENTS

| | | | |
|---|---|---|---|
| 2,932,810 | 4/1960 | Novak | 339—17 |
| 3,020,510 | 2/1962 | Kuch | 339—17 |
| 3,138,675 | 6/1964 | Krone | 339—17 |
| 3,208,026 | 9/1965 | Ruehlemann | 339—17 |
| 3,215,975 | 11/1965 | Kinkaid | 339—17 |
| 3,264,596 | 8/1966 | Bernutz | 339—17 |
| 3,300,686 | 1/1967 | Johnson et al. | 339—17 X |

MARVIN A. CHAMPION, *Primary Examiner.*

P. A. CLIFFORD, *Assistant Examiner.*